United States Patent
Sundahl et al.

(10) Patent No.: US 6,767,774 B2
(45) Date of Patent: Jul. 27, 2004

(54) PRODUCING MULTI-COLOR STABLE LIGHT EMITTING ORGANIC DISPLAYS

(75) Inventors: Robert C. Sundahl, Phoenix, AZ (US); Azar Assadi, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 99 days.

(21) Appl. No.: 10/284,631

(22) Filed: Oct. 31, 2002

(65) Prior Publication Data

US 2003/0052600 A1 Mar. 20, 2003

Related U.S. Application Data

(62) Division of application No. 09/473,150, filed on Dec. 28, 1999, now abandoned.

(51) Int. Cl.[7] .......................... H01L 21/00; H01L 21/44; H01L 21/82; H01L 21/331; H01L 21/20

(52) U.S. Cl. .......................... 438/151; 438/30; 438/34; 438/66; 438/69; 438/70; 438/82; 438/99; 438/116; 438/125; 438/129; 438/149; 438/311; 438/314; 438/479; 438/585; 438/587; 438/588; 438/780; 257/40; 257/642; 257/759; 349/93; 349/183

(58) Field of Search .......................... 438/30, 34, 66, 438/69, 70, 82, 99, 116, 125, 129, 149, 151, 311, 314, 479, 585, 587, 588, 780; 257/40, 642, 759; 349/93, 183

(56) References Cited

U.S. PATENT DOCUMENTS

| | | | | |
|---|---|---|---|---|
| 6,150,668 A | * | 11/2000 | Bao et al. | 257/40 |
| 6,211,538 B1 | * | 4/2001 | Park | 257/88 |
| 6,326,644 B1 | * | 12/2001 | Lee et al. | 257/91 |
| 6,372,154 B1 | * | 4/2002 | Li | 252/301.16 |
| 6,420,200 B1 | * | 7/2002 | Yamazaki et al. | 438/30 |
| 6,569,706 B2 | * | 5/2003 | Pakbaz et al. | 438/99 |
| 6,614,174 B1 | * | 9/2003 | Urabe et al. | 313/504 |
| 2002/0140346 A1 | * | 10/2002 | Tsukiyama | 313/502 |

FOREIGN PATENT DOCUMENTS

JP   08069880 A  *  3/1996  ........... H05B/33/10

* cited by examiner

Primary Examiner—John Nebling
Assistant Examiner—Stanetta Isaac
(74) Attorney, Agent, or Firm—Trop, Pruner & Hu, P.C.

(57) ABSTRACT

A polymer or organic light emitting display may be formed on a substrate by patterning the light emitting material using a screen printing technique. In this way, displays may be formed economically, overcoming the difficulties associated with photoprocessing light emitting materials. A binary optic material may be selectively incorporated into sol gel coatings coated over light emitting elements formed from the light emitting material. A tricolor display may be produced using a light emitting material that produces a single color.

11 Claims, 3 Drawing Sheets

PRODUCING MULTI-COLOR STABLE LIGHT EMITTING ORGANIC DISPLAYS

This is a divisional of prior application Ser. No. 09/473,150, filed Dec. 28, 1999, abandoned.

BACKGROUND

This invention relates generally to displays which have light emitting layers that are semiconductive polymers or oligomers (organic materials).

The different polymers and oligomers have been used for producing different displays. Light emitting oligomers are advantageous for producing smaller displays because of the process conditions (sputtering or vacuum evaporation) employed in fabricating oligomer displays. Oligomers have smaller chains, making them more stable materials than polymers because of their ability to withstand heat and moisture. Because of their relatively low solubility, oligomers are deposited by evaporation. This tends to make them most useful in smaller display applications.

Polymer displays, also known as organic light emitting displays (OLEDs) use layers of light emitting polymers. Unlike liquid crystal devices, the polymer displays actually emit light which may make them advantageous for many applications.

Generally, polymer displays use at least one semiconductive conjugated polymer sandwiched between a pair of contact layers. The contact layers produce an electric field which injects charge carriers into the polymer layer. When the charge carriers combine in the polymer layer, the charge carriers decay and emit radiation in the visible range.

One semiconductive conjugated polymer that may be used in polymer displays is poly(p-phenylenevinylene) (PPV) which emits green light. Another polymer which emits red-orange light is poly(methylethylhexyloxy-p-phenylenevinylene) (MEH-PPV).

Other polymers of this class are also capable of emitting blue light. In addition nitride substituted conjugated polymers may be used in forming the polymer displays.

Polymer displays may be formed from a substrate that may be a glass or metal foil substrate covered with an array of active elements. In one conventional structure the active elements may be thin film transistors (TFTs).

Conventionally, the polymer may be spun onto the substrate. However, lithography or photoprocessing of a conjugated polymer is a very difficult process. Electrodes are formed to control the light emission from the semiconductive polymer and then these polymers are spun onto the substrate. The polymer may include relatively small molecules like those used in fabric dyes, for example, having molecular weights between 500 and 1000. Another group of organics which are used with spin on resist are polymers with molecular weights between 100,000 and 1,000,000.

In addition to using spin on techniques, Cambridge Display, Ltd. reportedly has worked on a way to manufacture multicolored OLEDs deposited using ink-jet printing techniques. The promise of the technique is for large high resolution, low cost displays. The process uses a glass substrate with alternating stripes and grooves or channels and wells. In the prototype, the grooves form the subpixel areas into which various light emitting polymers are deposited. Ink-jet printing deposits red and yellow/green subpixels using PPV for green/yellow and rhodamine 101-doped PPV for red. The blue pixels are spin-coated, using a poly(dialkylfluorene) polymer. Surface treatments are utilized to realize fine patterning on either spin coat solutions or ink droplets with diameters of about 30 microns.

While the use of ink jet printing techniques for forming polymers displays has found some acceptance in forming displays with larger feature sizes, the technique has so far not been acceptable for forming smaller sized displays. In addition, the ink jet printing process is relatively limited in the resolution achievable.

With application techniques, such as ink jet printing techniques, the polymer display material is generally susceptible to air and moisture infiltration. In addition, the potential techniques for forming polymer displays are limited by the temperature sensitivity of the conjugated polymer material.

Producing a multi-color organic display is not an easy task. The available techniques for depositing different color layers are very difficult and also polymers which produce different colors have different lifetime and aging processes.

Thus, there is a continuing need for better ways to make polymer displays more cost effectively of smaller size.

SUMMARY

In accordance with one aspect, a method of forming a light emitting display includes forming a substrate with an electrode. A light emitting material is screen-printed on the substrate.

Other aspects are set forth in the accompanying detailed description and claims.

DETAILED DESCRIPTION

Polymer displays or organic light emitting displays (OLEDs) may be formed from a stack of a plurality of semiconductive light emitting layers or from an array made up of a plurality of repeating sets of three spatially displaced semiconductive light emitting polymers. In the case of the polymer stack, the interaction between the layers, both chemically and optically, is balanced against the inherent compactness achieved via the stack.

While the present invention is applicable to either technique, in the description that follows, for illustration purposes, a display with spaced single layer polymer light emitting layers is described. A stacked type display is described in U.S. Pat. No. 5,821,690 to Martens et al. and assigned to Cambridge Display Technology, Ltd. That patent also sets forth a large number of light emitting polymer materials which may be useful in either type of polymer display. In addition, U.S. Pat. No. 5,707,745 to Forrest et al. discloses another stacked polymer display and also discloses additional materials which may be used as light emitting polymers in either type of polymer display.

Figure 1:
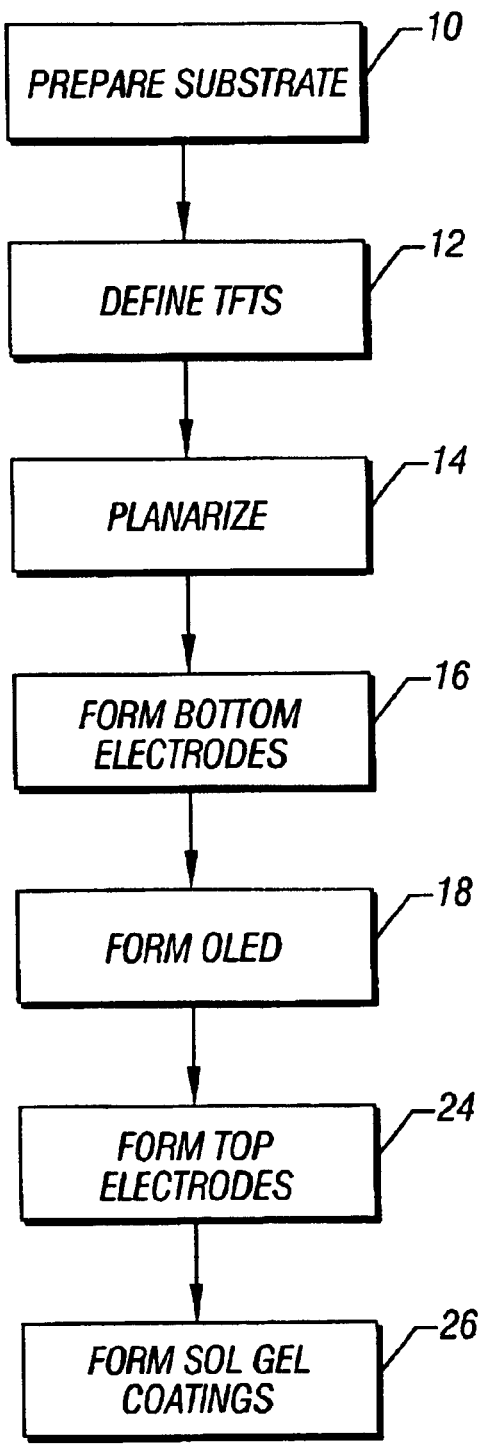
FIG. 1 shows a process for forming a polymer display in accordance with one embodiment of the present invention.

Referring to FIG. 1, in accordance with one embodiment of the present invention, a polymer display may be formed by preparing a substrate, such as a glass or metal foil substrate, as examples, to receive the ensuing layers, as indicated in block 10. In one embodiment of the present invention, active elements such as thin film transistors (TFTs), as indicated in block 12, may be defined on top of the substrate. In such case, the display may be known as on active matrix display these active elements may be operated to selectively activate the polymers to emit light. Alternatively, in a passive matrix display, the polymers may be controlled from a pair of spaced electrodes on both sides of the polymer without active elements being formed on the substrate under the polymer materials.

After the active elements have been defined, the resulting structure is advantageously planarized (block 14). For example, in one embodiment of the present invention, thin film transistor circuitry may be provided for each of the red, green and blue color planes in an RGB system. While an RGB color plane system is described herein, other color planes may be used as well.

Initially, a bottom electrode for each polymer (e.g., R, G and B) are formed as indicated in block 16. Conventionally, the bottom electrodes are formed of indium tin oxide (ITO) which is both transparent and conductive. Conventional masking techniques may be utilized to define the desired shape for the bottom electrodes.

The thin film transistors may be formed of amorphous silicon. Generally, a capacitor is added at each pixel because of the relatively low mobility of amorphous silicon. Other thin film transistor materials include conventional polysilicon and excimer polysilicon which is polysilicon which has been annealed using an excimer laser. The use of single crystal silicon (x-Si) thin film transistors is also being investigated.

Figure 2:
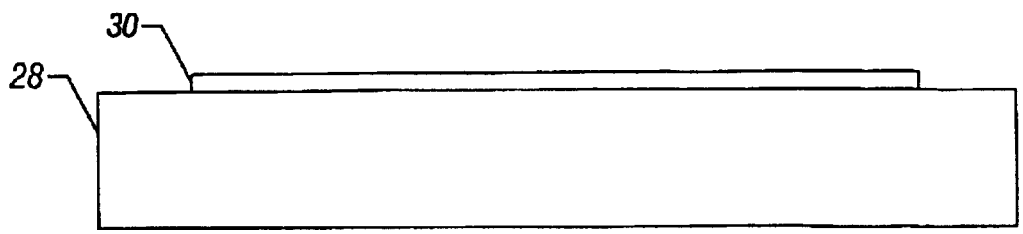
FIGS. 2 through 6 show enlarged cross-sectional views of the steps in forming a polymer display in accordance with one embodiment of the present invention.

The thin film transistor array may be planarized if desired, by applying a suitable material over the thin film transistor arrays. As a result, the substrate 28 may have a relatively planarized thin film transistor array 30 formed thereon, as illustrated in FIG. 2.

Figure 3:
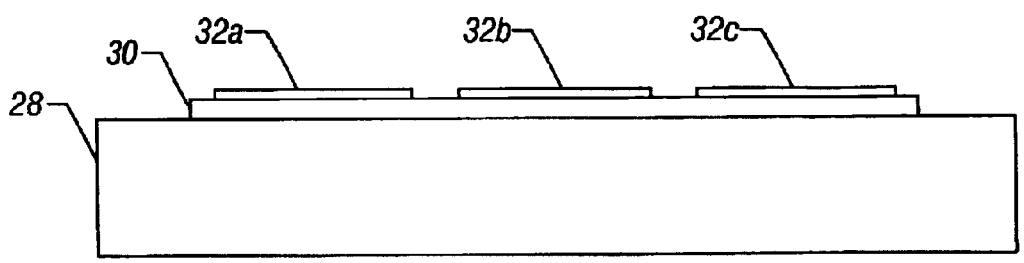

The bottom electrodes 32a, 32b and 32c may be formed atop the thin film transistor array 30, with one circuit defined for each of the three planes of a tricolor plane, for each pixel, as indicated in FIG. 3. Thus, a large number of the tricolor pixels may be formed atop the substrate 28.

Figure 4:
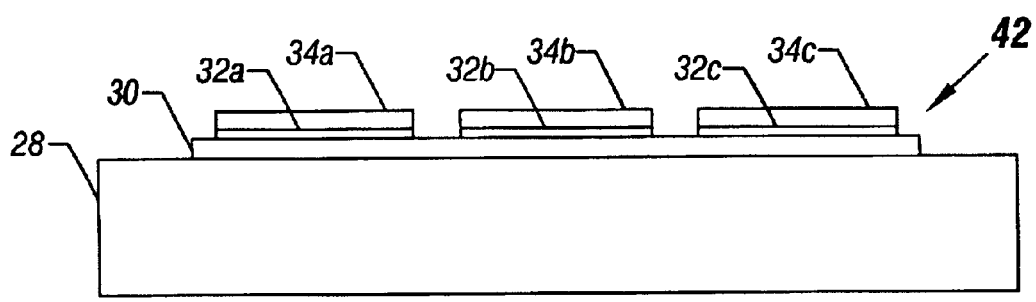

Thereafter, a first light emitting polymer may be deposited as indicated at 34a, in FIG. 4 and at block 18 in FIG. 1. In accordance with one embodiment of the present invention, the light emitting polymer is deposited using screen printing technology.

Figure 7:
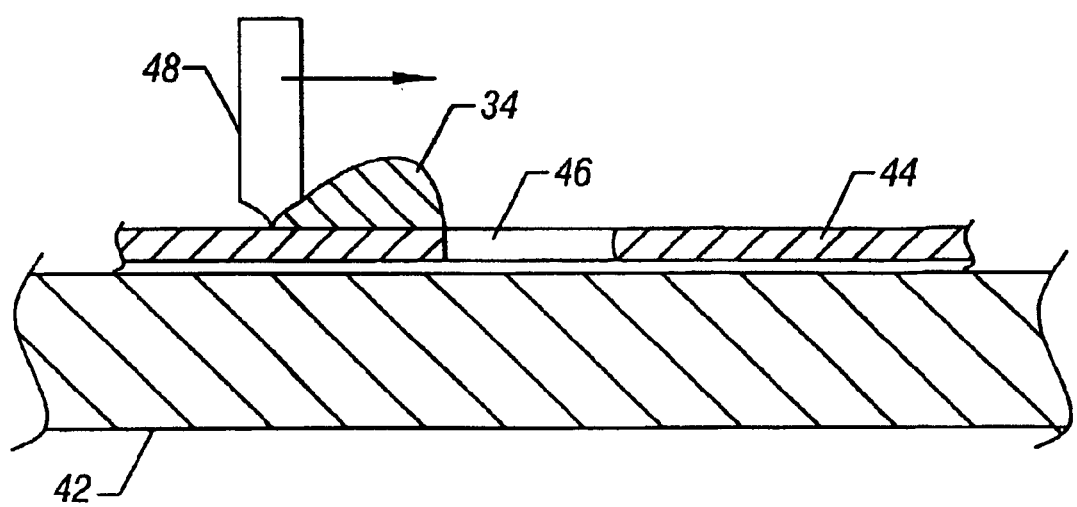
FIG. 7 is an enlarged cross-sectional view showing the process of screen printing light emitting polymers onto a substrate.
Figure 8:
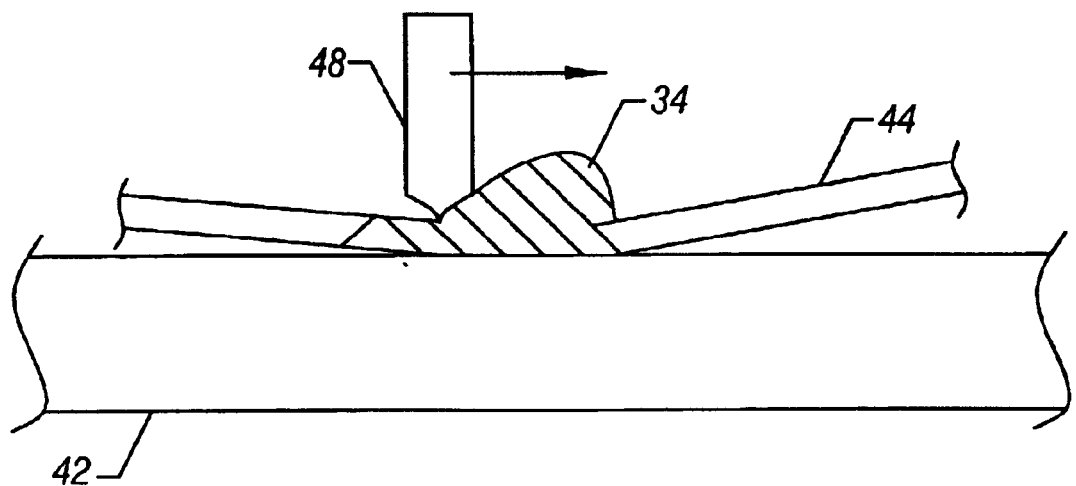
FIG. 8 is an enlarged cross-sectional view of the embodiment shown in FIG. 7 after a squeegee has moved across a stencil, to the right.

Referring to FIG. 7, a stencil 44 having the desired openings 46 may be positioned over the substrate 42. The modified substrate 42 may include the thin film transistor array 30 and the bottom electrodes 32 in accordance with one embodiment of the present invention illustrated in FIG. 4. A squeegee 48 is reciprocated across the stencil 44 so that the light emitting polymer material 34 is squeezed through the openings 46 and deposited in a desired pattern on the substrate 42, as illustrated in FIG. 8.

Advantageously, the material 34 is in a paste-like consistency. By choosing OLED materials of appropriate molecular weights and using the fillers of a predetermined viscosity, compositions of light emitting polymers of suitable consistencies may be obtained in this fashion.

Figure 5:
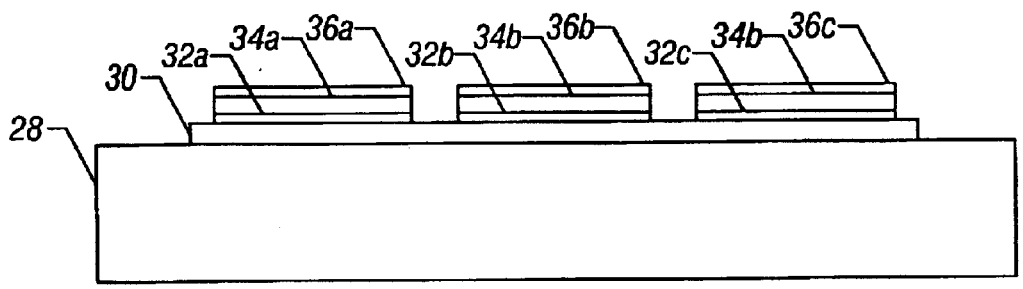

The resulting structure, shown in FIG. 5, includes a plurality of light emitting elements 40a, 40b and 40c each emitting the same color of light in one embodiment of the invention. A top electrode 36 is formed over each display element as indicated in block 24 of FIG. 1. Collectively the three elements 40a, 40b and 40c define a single tricolor display pixel.

Figure 6:
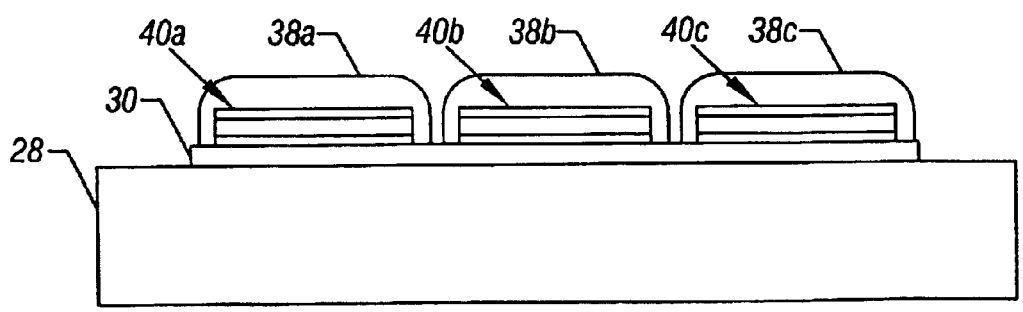

Thereafter, the elements 40 may be covered with a sol gel 38, as shown in FIG. 6 and is illustrated at block 26 in FIG. 1. The sol gel may form a protective layer fabricated as a continuous film. The sol gel material, when cured, provides a substantial barrier to moisture and oxygen ingression. Ideally, the barrier properties are chosen to provide permanent protection for the polymer display. In this case, subsequent processing (usually the addition of a second glass plate and a sealing operation) may be unnecessary. In any case, the coating provides substantial protection to an exposed structure during subsequent fabrication steps. Protection from light exposure, particularly ultraviolet light, can also be provided by the appropriate choice of material and filter additives.

The sol gel coating may also include binary optical materials. These binary optical materials may be used to produce a tricolor display from a light emitter that emits a single wavelength. For example, different binary optical materials may be used in the sol gel coatings 38b and 38c to produce second and third colors from the same light emitting layers 34b and 34c. In this case, three different sol gels may be coated over the layers 34 using patterning techniques. Suitable binary optical coatings that may be incorporated in sol gels are described in Suleski, T. J. and Oshea, D. C., "Gray Scale Mask for Diffractive Optics Fabrication", Appl. Optics 34, 7507 (1995).

For example, a yellow light emitting PPV polymer may be covered with sol gel doped with suitable binary optical materials to produce three different colors per pixel. For example, in one embodiment binary optical materials may be chosen to produce red, green and blue (RGB) (or an approximation thereof) pixels.

In addition, the sol gel may act as either a refractive or diffractive lens. The sol gel material may be shaped in a naturally curved shape or may be defined in a plurality of layers of decreasing size to form a stepped lens structure.

Advantageous sol-gel hybrid glasses for use in the present invention may be formed using low temperature formation processes. Thus, the glasses may be shaped and formed using techniques comparable to those utilized in connection with forming photoresists. That is, ultraviolet light may be used to expose a portion of the sol gel materials to develop that material so that the remaining portion may be removed. Also, the sol gel may exhibit advantageous transmissivity as compared to conventional materials used to form lenses.

Sol gel glasses may be formed, for example, by hydrolysis of tetraethylorthosilicate (TEOS) and/or tetramethylorthosilicate (TMOS). After hydrolysis, these materials may be subjected to oxolation or oxygen bridge formation and polycondensation. The result is a silicon oxide complex which is solvent swollen to form a polymerized network. If a photoinitiator is included in the complex, the material may be shaped using conventional photoresist patterning techniques.

In accordance with one embodiment, a sol gel hybrid glass may be-prepared by hydrolysis polycondensation of the methacrylate group substituted silane in the presence of water. The gel synthesis happens, allowing the methylacryloxypropyl trimethoxysilane or glysidoxypropyltrimethylsilane precursor material to react with diluted acid or base water solution, for example, in a molar ratio of 1:2 respectively for several hours.

Before spin coating, propriety amounts of 1-hydroxycyclohexyl phenyl ketone may be added as a photoinitiator to initiate polymerization of unsaturated glass hybrid polymer.

In one embodiment, the gel may be filtered by a 0.1 millimeter filter to remove aggregated polymer particles and to form a film with good surface quality. Films may then be deposited and prebaked, for example, at 60° C. for 15 minutes, in one embodiment. The resulting film thickness is adjustable by varying spinning speed and use of solvents such as methanol, ethanol or xylene.

The spin coated films may be exposed by a mercury ultraviolet lamp or other light source through an opening in a photomask, for example, for 1 to 30 minutes in one embodiment to form patterns as shown in FIG. 6. In particular, a UV mask may be situated over the hybrid sol gel located, as shown in FIG. 6, to create an exposure pattern in the sol gel. The patterned structure may be obtained by developing the sol gel in a developer, such as isopropanol, to remove unexposed parts of the sol gel. After this removal step, the film may be postbaked, for example, at 1000° C. to 200° C. for 10 to 60 minutes or less, in one embodiment, to harden the film. The film may be formed in a plurality of discrete layers having distinct optical properties in one embodiment of the invention.

If particular material properties are desired, titanium, silicon or zirconium, or the prehydrolysed alkoksides of these materials can be added to the solution of the methacrylate group substituted silanes. For example, titanium (IV)-propoxide and zirconium (IV)-propoxide may be used. Methacrylic acid may be used to prevent the zirconium propoxide precipitation.

A gray scale mask may be used to produce desired sol gel shapes. See Suleski, T. J. and Oshea, D. C., "Gray Scale Mask for Diffractive Optics Fabrication," Appl. Optics 34, 7507 (1995). A conventional mask material, which may be quartz or glass is coated conventionally with chromium. In this way, the sol gel may be deposited and patterned at a temperature of less than 200° C.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of forming a light emitting display comprising:

forming a substrate with an electrode; and screen printing a light emitting material on said substrate; and covering said light emitting material with a sol gel.

2. The method of claim 1 wherein forming a substrate with an electrode includes forming a substrate with a thin film transistor defined thereon.

3. The method of claim 2 wherein forming a substrate with an electrode further includes planarizing a substrate with a thin film transistor formed thereon.

4. The method of claim 3 including forming a bottom electrode for said light emitting material.

5. The method of claim 1 wherein screen printing a light emitting material includes screen printing an array of three light emitting material coatings in proximity to one another.

6. The method of claim 5 including forming an electrode under each coating of said array.

7. The method of claim 6 including covering said array with a sol gel.

8. The method of claim 7 including forming said sol gel at a temperature less than 200° C.

9. The method of claim 7 including coating binary optic materials over said array to produce a tricolor array.

10. The method of claim 9 including incorporating the binary optic material into said sol gel.

11. The method of claim 10 including adding a different binary optic material to the sol gel over at least two of said coatings of said array to produce two colors.

\* \* \* \* \*